United States Patent
Horiuchi et al.

(10) Patent No.: US 10,998,216 B2
(45) Date of Patent: May 4, 2021

(54) SINTERED BODY AND ELECTROSTATIC CHUCK

(71) Applicant: SHINKO ELECTRIC INDUSTRIES CO., LTD., Nagano (JP)

(72) Inventors: Michio Horiuchi, Nagano (JP); Masakuni Miyazawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 267 days.

(21) Appl. No.: 15/616,857

(22) Filed: Jun. 7, 2017

(65) Prior Publication Data

US 2017/0358476 A1    Dec. 14, 2017

(30) Foreign Application Priority Data

Jun. 9, 2016  (JP) .............................. JP2016-115054

(51) Int. Cl.
*H01L 21/00* (2006.01)
*H01L 21/683* (2006.01)
(Continued)

(52) U.S. Cl.
CPC .......... *H01L 21/6833* (2013.01); *C04B 35/10* (2013.01); *C04B 41/009* (2013.01); *C04B 41/5031* (2013.01); *C04B 41/87* (2013.01); *C04B 41/91* (2013.01); *H01L 21/67017* (2013.01); *C04B 2235/3206* (2013.01); *C04B 2235/3208* (2013.01);
(Continued)

(58) Field of Classification Search
CPC ........... H01L 21/6833; H01L 21/67017; C04B 35/10; C04B 41/009; C04B 41/5031; C04B 41/87; C04B 41/91; C04B 2235/3206; C04B 2235/3208; C04B 2235/3217; C04B 2235/3225; C04B 2235/3418; C04B 2235/3427; C04B 2235/77; C04B 2235/945
See application file for complete search history.

(56) References Cited

U.S. PATENT DOCUMENTS

| | | | |
|---|---|---|---|
| 6,108,189 A * | 8/2000 | Weldon | ............... C23C 16/4586 279/128 |
| 6,606,234 B1 * | 8/2003 | Divakar | ............. H01L 21/6833 361/234 |

(Continued)

FOREIGN PATENT DOCUMENTS

| | | |
|---|---|---|
| JP | 2004-508728 | 3/2004 |
| JP | 2008-166509 | 7/2008 |

(Continued)

OTHER PUBLICATIONS

Japanese Office Action dated Mar. 10, 2020, English translational included, 6 pages.

*Primary Examiner* — Pete T Lee
(74) *Attorney, Agent, or Firm* — Rankin, Hill & Clark LLP (57) ABSTRACT

A sintered body includes a ceramic substrate including sintered oxide particles, a through-hole formed in the ceramic substrate such that the side surfaces of the oxide particles exposed from an inner wall of the through-hole form a flat surface, and a porous body disposed in the through-hole, the porous body including spherical oxide ceramic particles and a mixed oxide configured to bind the spherical oxide ceramic particles.

14 Claims, 7 Drawing Sheets

(51) Int. Cl.
*H01L 21/67* (2006.01)
*C04B 35/10* (2006.01)
*C04B 41/00* (2006.01)
*C04B 41/50* (2006.01)
*C04B 41/87* (2006.01)
*C04B 41/91* (2006.01)

(52) U.S. Cl.
CPC .............. *C04B 2235/3217* (2013.01); *C04B 2235/3225* (2013.01); *C04B 2235/3418* (2013.01); *C04B 2235/3427* (2013.01); *C04B 2235/77* (2013.01); *C04B 2235/945* (2013.01)

(56) References Cited

U.S. PATENT DOCUMENTS

| | | | | |
|---|---|---|---|---|
| 6,680,013 | B1* | 1/2004 | Stein | B29C 67/202 264/44 |
| 2002/0052288 | A1* | 5/2002 | Krell | C04B 38/00 501/105 |
| 2003/0104186 | A1* | 6/2003 | Ito | H01L 21/6833 428/209 |
| 2010/0126132 | A1* | 5/2010 | Merkel | F01N 3/0222 55/523 |
| 2013/0312336 | A1* | 11/2013 | Tomikawa | C09K 3/1418 51/309 |
| 2013/0338265 | A1* | 12/2013 | Masatomi | C08K 5/5419 523/456 |
| 2014/0189998 | A1 | 7/2014 | Kusunose | |
| 2015/0155193 | A1* | 6/2015 | Hsu | H01J 37/32715 156/345.24 |
| 2016/0242283 | A1* | 8/2016 | Hayashi | H05K 1/0313 |

FOREIGN PATENT DOCUMENTS

| | | |
|---|---|---|
| JP | 2010-228935 | 10/2010 |
| JP | 2010-228946 | 10/2010 |
| JP | 2014-008432 | 1/2014 |
| JP | 2014-135310 | 7/2014 |

\* cited by examiner

SINTERED BODY AND ELECTROSTATIC CHUCK

CROSS-REFERENCE TO RELATED APPLICATION

The present application claims priority from Japanese Patent Application No. 2016-115054 filed on Jun. 9, 2016, the entire content of which is incorporated herein by reference.

BACKGROUND

Technical Field

The present invention relates to a sintered body and an electrostatic chuck having the sintered body.

Related Art

In the related art, there are porous ceramics having a lot of pores formed therein. Such ceramics are used as conduit parts for heat-transfer gases of electrostatic chucks or various filters.

[Patent Document 1] Japanese Patent Application Laid-Open No. 2004-508728

[Patent Document 2] Japanese Patent Application Laid-Open No. 2010-228935

[Patent Document 3] Japanese Patent Application Laid-Open No. 2010-228946

[Patent Document 4] Japanese Patent Application Laid-Open No. 2014-8432

[Patent Document 5] Japanese Patent Application Laid-Open No. 2014-135310

As will be described below with preliminary technologies, an electrostatic chuck has gas conduit parts composed of porous bodies disposed in a ceramic substrate.

As a method of disposing porous bodies in a ceramic substrate, there is a method of separately making the ceramic substrate and the porous bodies as sintered bodies and integrating them by inserting the porous bodies into through-holes of the ceramic substrate.

Also, there is a method of filling through-holes of an unsintered ceramic composition body with paste for porous bodies which is a precursor of the porous bodies, and sintering the ceramic composition body and the paste at the same time.

These methods have limitations in reducing the sizes of gas conduit parts, and have a problem in which the accuracy of the shapes, sizes, and positions of gas conduit parts is not sufficiently obtained. Also, since the inner walls of through-holes of unsintered ceramic composition bodies have surfaces with micro irregularities, it is difficult to fill the through-holes with paste for porous bodies, and the through-holes are likely to be unevenly filled.

SUMMARY

Exemplary embodiments of the invention provide a sintered body having a novel structure in which it is possible to dispose a porous body in a through-hole of a ceramic substrate with high reliability, and an electrostatic chuck.

A sintered body, according to an exemplary embodiment, comprises:

a ceramic substrate including sintered oxide particles;

a through-hole formed in the ceramic substrate such that the side surfaces of the oxide particles exposed from an inner wall of the through-hole form a flat surface; and a porous body disposed in the through-hole, the porous body including spherical oxide ceramic particles and a mixed oxide configured to bind the spherical oxide ceramic particles.

An electrostatic chuck, according to an exemplary embodiment, comprises:

a ceramic substrate including sintered oxide particles;

a through-hole formed in the ceramic substrate such that the side surfaces of the oxide particles exposed from an inner wall of the through-hole form a flat surface;

a gas conduit part including a porous body disposed in the through-hole, the porous body including spherical oxide ceramic particles and a mixed oxide configured to bind the spherical oxide ceramic particles; and an electrostatic electrode disposed in the ceramic substrate.

A method of manufacturing a sintered body, according to an exemplary embodiment, comprises:

preparing a sintered ceramic substrate;

forming a through-hole in the ceramic substrate;

filling the through-hole with paste including spherical oxide ceramic particles and a mixed oxide; and sintering the paste, thereby forming a porous body including the spherical oxide ceramic particles bound by the mixed oxide, in the through-hole.

According to the following disclosure, in the sintered body, the porous body is disposed in the through-hole of the ceramic substrate formed by sintering oxide particles.

The sintered body is obtained by forming the through-hole of the sintered ceramic substrate, and filling the through-hole with the paste for the porous body which is a precursor for the porous body, and performing sintering.

In this case, the side surfaces of a plurality of oxide particles exposed from the inner wall of the through-hole of the ceramic substrate form a flat surface, and thus the inner wall of the through-hole has a flat surface. Therefore, when the through-hole of the ceramic substrate is filled with the paste for the porous body, the resistance is small. Therefore, it is possible to satisfactorily fill the through-hole with the paste for the porous body.

Also, the porous body is made by binding spherical oxide ceramic particles by a mixed oxide such that desired porosity is obtained and contraction is suppressed from occurring during sintering.

Therefore, it is possible to dispose the porous body in the through-hole of the ceramic substrate with high reliability. Therefore, in a case of using the porous body as a gas conduit part, it is possible to improve the accuracy of the shape, size, and positions of the gas conduit part.

DETAILED DESCRIPTION

Hereinafter, embodiments will be described with reference to the accompanying drawings.

Prior to a description of embodiments, preliminary technologies underlying them will be described. A description of the preliminary technologies includes the contents of unknown novel technologies as the contents of personal examination of the inventor.

Each of electrostatic chucks has gas conduit parts formed for supplying a heat-transfer gas to its front surface side. Some of electrostatic chucks usable in dry etching equipment and the like have gas conduit parts composed of porous bodies in order to prevent electric discharge at the gas conduit parts. In such an electrostatic chuck, porous bodies are disposed in a ceramic substrate so as to extend in the thickness direction.

In a method of disposing porous bodies in a ceramic substrate, first, sintered porous bodies and a sintered substrate are made separately.

According to a method of making a sintered porous body, a pore forming agent is added to an unsintered general ceramic composition body so as to occupy a predetermined proportion of volume, and then sintering is performed, whereby the pore forming agent is removed and a sintered porous body are obtained. As the pore forming agent, polymethyl methacrylate (PMMA) and so on can be used.

Figure 1:
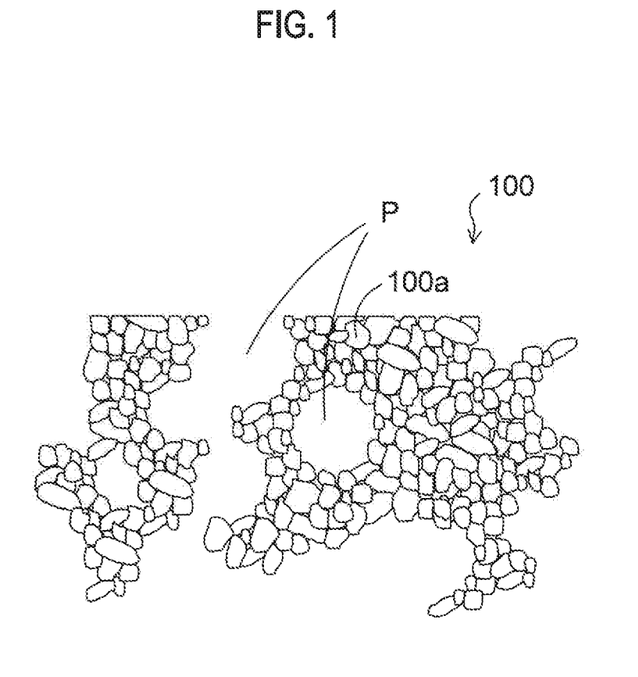
FIG. 1 is a cross-sectional view schematically illustrating a porous body according to a preliminary technology.

In this way, it is possible to obtain a porous body 100 in which a number of ceramic particles 100*a* is sintered and pores P formed therein are connected as shown in FIG. 1 by action of a pore forming agent.

Such a method of making a sintered porous body using a pore forming agent has a problem in which closed pores which are cut off from the outside are formed and it is impossible to control the sizes of the pores P.

Sintered porous bodies and a sintered substrate having through-holes are prepared separately, and are processed into predetermined shapes. Then, they are integrated by inserting the sintered porous bodies into the through-holes of the sintered substrate. In order to prevent the sintered porous bodies from coming out of the through-holes, an adhesive medium such as an epoxy resin is provided on the interfaces of the sintered porous bodies and the sintered substrate.

Also, there is a method of inserting sintered porous bodies into through-holes of a sintered substrate, and fixing the sintered porous bodies by performing a heating process at a high temperature close to a sintering temperature, without using an adhesive medium.

This method has a limitation in processing the sintered porous bodies into a small size and accurately inserting the sintered porous bodies into the through-holes of the sintered substrate. Therefore, it is difficult to reduce the diameter of the through-holes of the ceramic substrate to a diameter smaller than about 3 mm.

Also, in the case where any adhesive medium is not used, it is required to accurately process the sintered porous bodies and insert them such that every sintered porous body comes into contact with the whole of the inner wall of a corresponding through-hole of the sintered substrate. However, this work is actually difficult.

If every sintered porous body is not in contact with the whole of the inner wall of a corresponding through-hole of the sintered substrate, the surfaces of the sintered porous bodies and the sintered substrate fixed to each other are uneven, and thus cause the flow property of a gas in the sintered porous bodies to deteriorate.

Further, in a case of fixing the sintered porous bodies with an adhesive medium, the adhesive medium deteriorates due to plasma, and thus causes a defect of an electrostatic chuck.

Also, as another method, there is a method of forming through-holes in an unsintered ceramic composition body, and filling the through-holes with paste for the porous bodies which is a precursor for the porous bodies, and sintering them at the same time.

In this method, when the sintered porous bodies and the sintered substrate are made by sintering, they contract. Therefore, the size of the sintered porous bodies is unlikely to match with the size of the through-holes, and thus gaps and separation are likely to occur. Therefore, it is impossible to sufficiently obtain the accuracy of the shape, size, and positions of gas conduit parts composed of the sintered porous bodies.

Also, since the inner walls of the through-holes of the unsintered ceramic composition body have surfaces with micro irregularities, when the through-holes are filled with the paste for the porous bodies, the through-holes are likely to be unevenly filled, and it is difficult to satisfactorily fill the through-holes.

According to a sintered body of an embodiment to be described below, it is possible to solve the above-described problems.

Embodiment

Figure 2A:
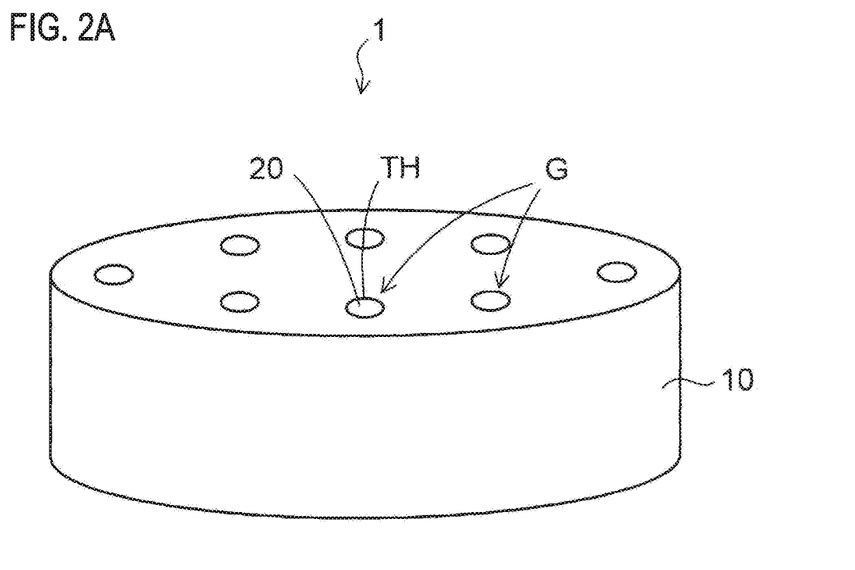
FIGS. 2A and 2B are a perspective view and a partial cross-sectional view illustrating a sintered body having porous bodies according to an embodiment, respectively.
Figure 2B:
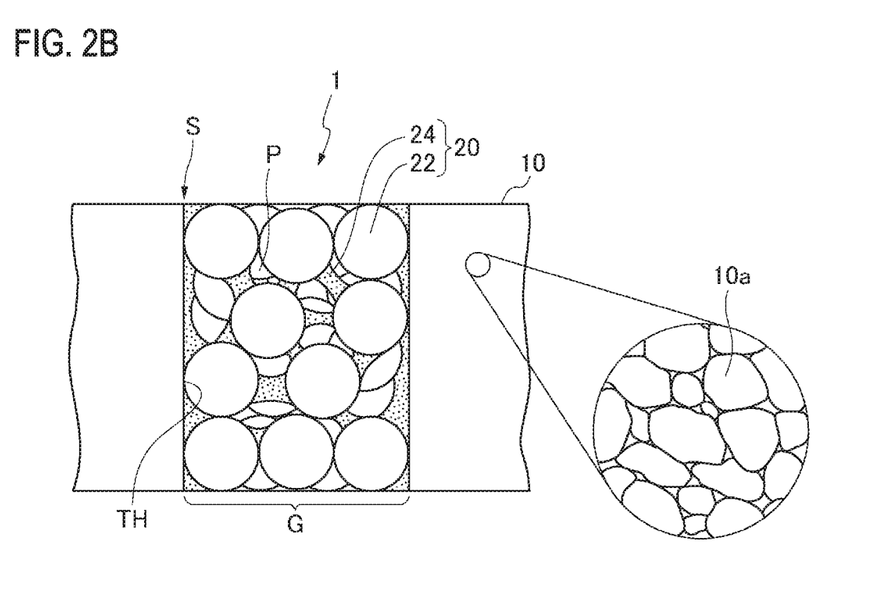
Figure 4A:
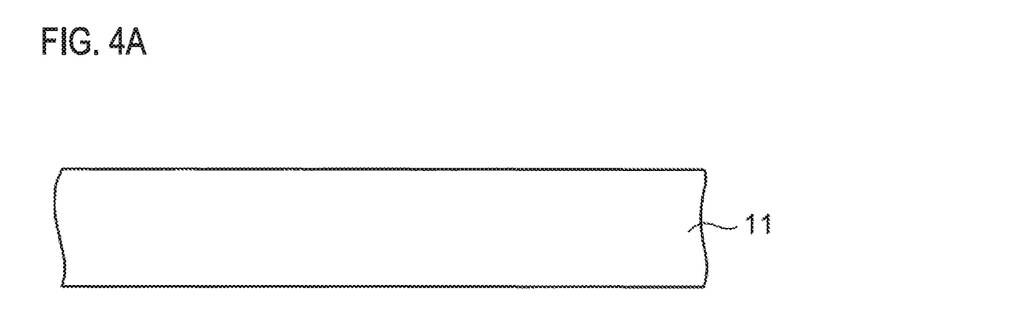
FIGS. 4A to 4C are cross-sectional views illustrating a first part of a method of manufacturing the sintered body of the embodiment.
Figure 4B:
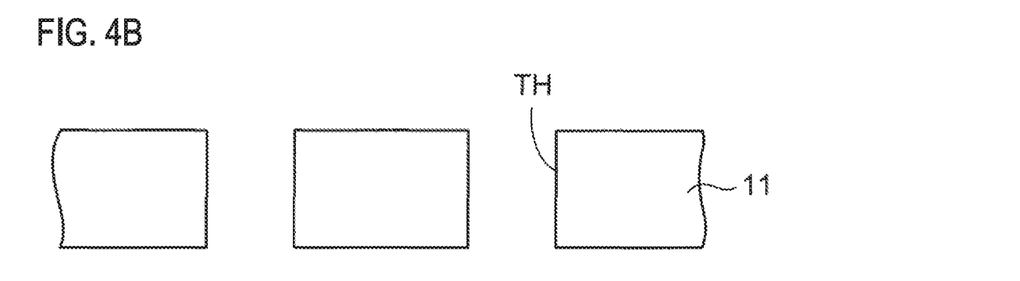
Figure 4C:
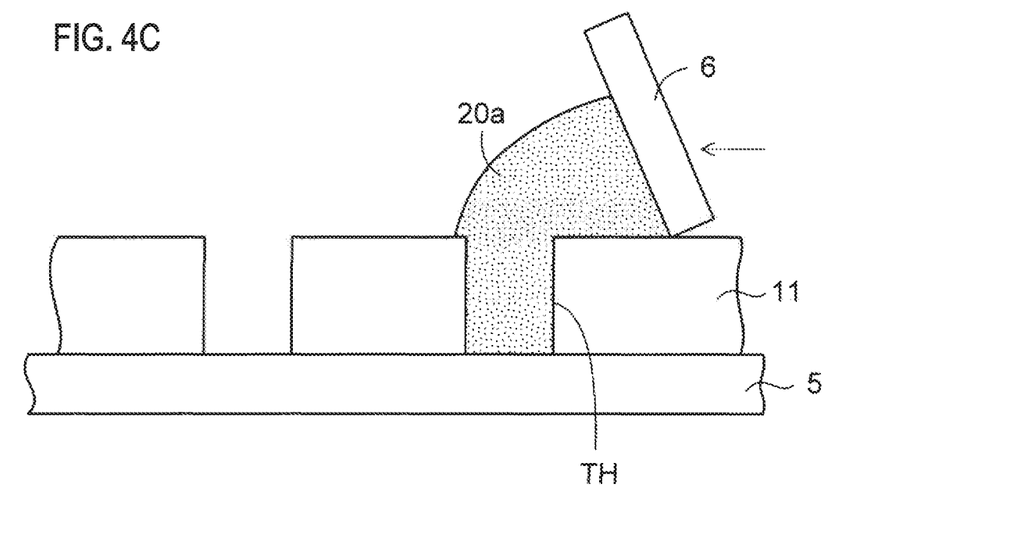
Figure 5A:
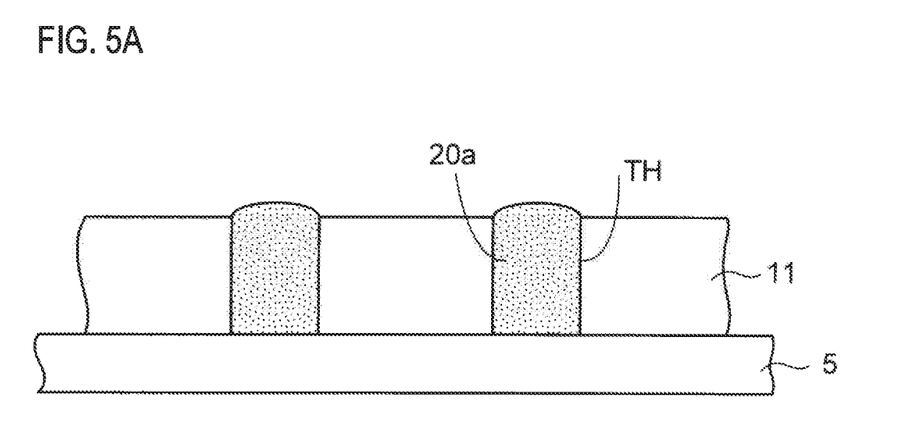
FIGS. 5A to 5C are cross-sectional views illustrating a second part of the method of manufacturing the sintered body of the embodiment.
Figure 5B:
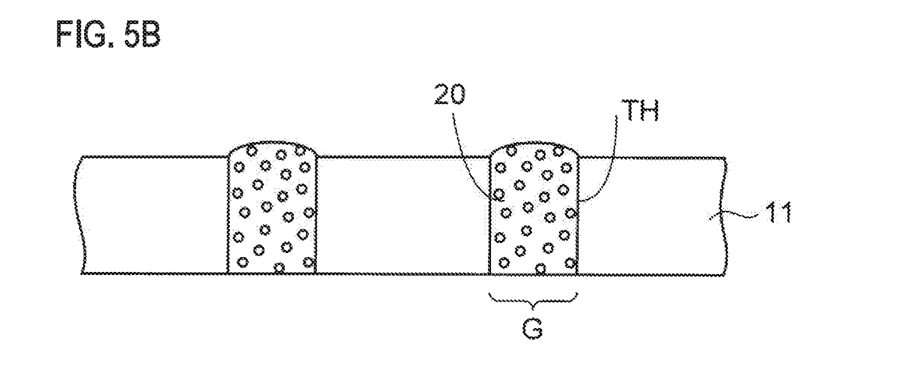
Figure 5C:
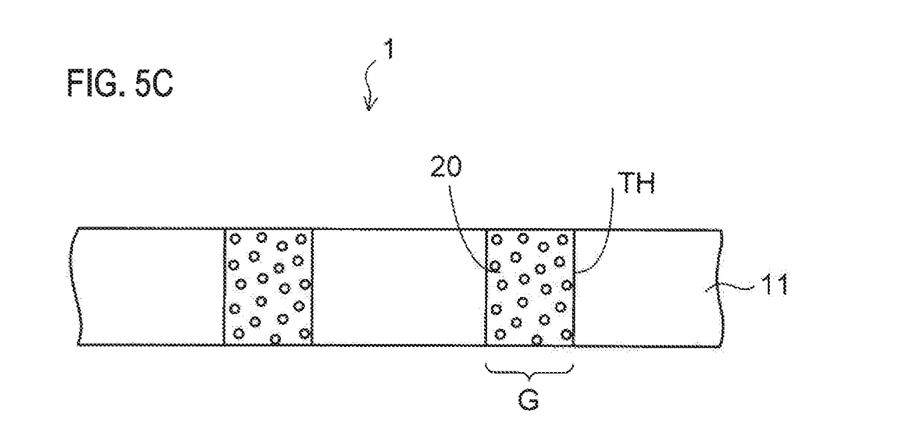
Figure 6:
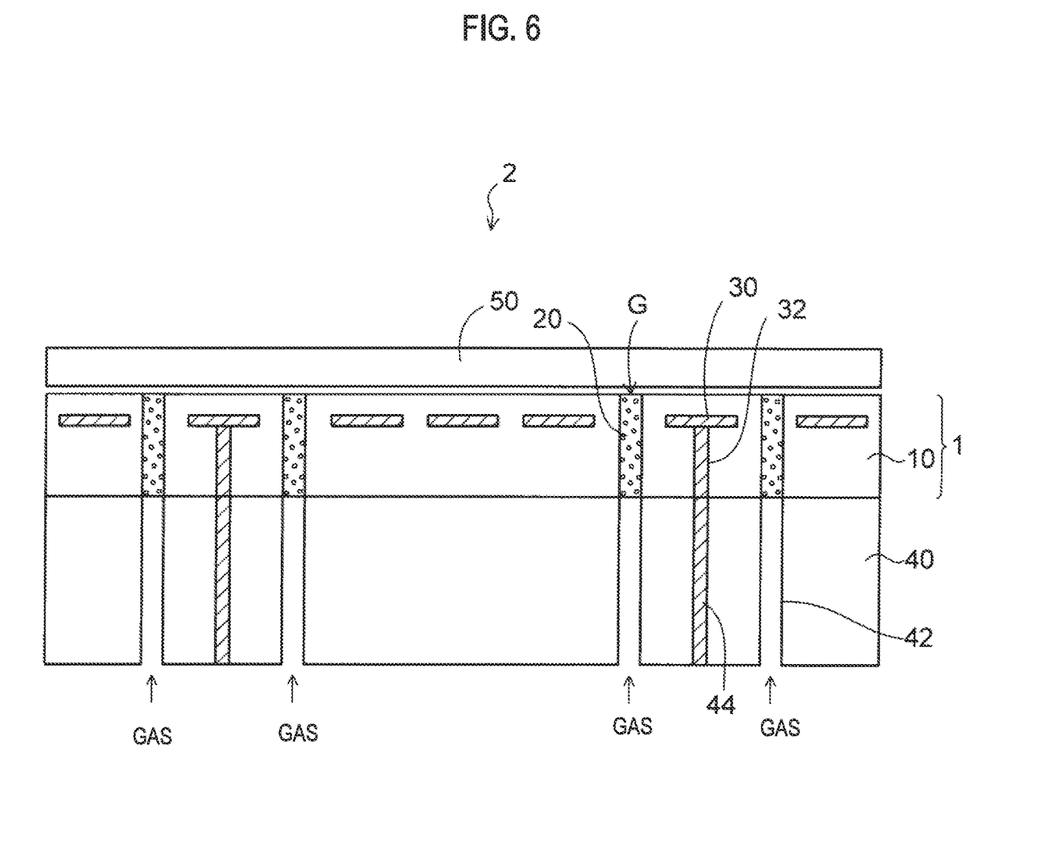
FIG. 6 is a cross-sectional view illustrating an electrostatic chuck of the embodiment.

FIGS. 2A and 2B are views for explaining a sintered body of an embodiment, and FIGS. 4A to 5C are views for explaining a method of manufacturing the sintered body of the embodiment, and FIG. 6 is a view illustrating an electrostatic chuck of the embodiment.

As shown in FIG. 2A, a sintered body 1 of an embodiment includes a ceramic substrate 10 having through-holes TH formed therein in the thickness direction, and porous bodies 20 disposed in the through-holes TH. The porous bodies 20 constitute gas conduit parts G.

FIG. 2B is a partial enlarged cross-sectional view illustrating the aspect of a through-hole TH of the ceramic substrate 10 of FIG. 2A and a porous body 20 disposed in the through-hole.

As shown in FIG. 2B, the ceramic substrate 10 is made by sintering a plurality of oxide particles 10*a*. Preferred examples of the oxide particles 10*a* are aluminum oxide particles. The diameters of the oxide particles 10*a* are, for example, about 5 µm.

The through-holes TH of the ceramic substrate 10 are formed by boring through the ceramic substrate 10 in the thickness direction with a drill or the like after the substrate is sintered, as will be described below.

Therefore, from the inner walls of the through-holes TH of the ceramic substrate 10, the processed surfaces of a plurality of oxide particles 10a are exposed in a state where those surfaces are stacked in a vertical direction. Further, the side surfaces of the plurality of oxide particles 10a exposed from the inner walls of the through-holes TH of the ceramic substrate 10 form flat surfaces, and thus the inner walls of the through-holes TH have flat surfaces.

Like this, in the wall surfaces of the through-holes TH of the ceramic substrate 10, the side surfaces of the plurality of oxide particles 10a stacked in the vertical direction form flat surfaces S.

Each porous body 20 to be in a through-hole TH of the ceramic substrate 10 is formed of a plurality of spherical oxide ceramic particles 22, and a mixed oxide 24 for binding the plurality of spherical oxide ceramic particles 22.

The diameters of the spherical oxide ceramic particles 22 are in a range between 30 μm and 1000 μm, preferably, in a range between 100 μm and 300 μm. As preferred examples of the spherical oxide ceramic particles 22, there are spherical aluminum oxide particles. Also, 80% or more by weight (97% or less by weight) of spherical oxide ceramic particles 22 are contained in the porous bodies 20.

The mixed oxide 24 adheres to some portions of the outer surfaces (spherical surfaces) of the spherical oxide ceramic particles 22, and supports them. Also, the mixed oxide 24 adheres to the inner walls of the through-holes TH of the ceramic substrate 10. The diameters of the spherical oxide ceramic particles 22 are, for example, about 100 μm.

In this way, pores P are formed in the porous body 20. The porosity of pores P which are formed in the porous body 20 is between 20% and 50% of the volumes of the porous body 20. From the inner surfaces of the pores P, some portions of the outer surfaces of the spherical oxide ceramic particles 22 and the mixed oxide 24 are exposed.

The pores P in the porous body 20 are connected to the outside so as to permit the passage of gas from the lower side toward the upper side.

As described above, in the porous body 20, the spherical oxide ceramic particles 22 are dispersed such that predetermined porosity is obtained, and the mixed oxide 24 adheres to some portions of the outer surfaces of the spherical oxide ceramic particles 22.

The mixed oxide 24 of the porous body 20 may be composed of oxides of two or more selected from silicon, magnesium, calcium, aluminum, and yttrium.

Also, preferably, the porous body 20 is formed using aluminum oxide as a main component, and the weight ratio of aluminum oxide is set between 80% by weight and 97% by weight.

In a case where the ceramic substrate 10 is formed of aluminum oxide, the ceramic substrate 10 contains silicon, magnesium, calcium, and yttrium as other components.

The composition ratio of silicon, magnesium, calcium, and yttrium in the ceramic substrate 10 is set to be the same as the composition ratio of silicon, magnesium, calcium, and yttrium in the mixed oxide 24.

If the composition ratio of impurities in the ceramic substrate 10 is set to be the same as the composition ratio of impurities in the mixed oxide 24 as described above, when the sintered body is made by the following manufacturing method, mass transfer between them does not occur. Therefore, it is possible to secure flatness of the interfaces of the ceramic substrate 10 and the porous bodies 20.

Also, the mixed oxide 24 of the porous body 20 is composed of crystalline particulate materials and amorphous materials. Specifically, the mixed oxide 24 obtained by sintering contains silicon oxide ($SiO_2$), magnesium oxide (MgO), calcium oxide (CaO), aluminum oxide ($Al_2O_3$), and yttrium oxide ($Y_2O_3$).

If the weight ratios of $Al_2O_3$, MgO, and $Y_2O_3$ are increased, in the mixed oxide 24, crystalline particulate materials composed of a corundum phase ($Al_2O_3$), a spinel phase ($MgAl_2O_4$), and a garnet phase ($3Y_2O_3$-$5Al_2O_3$) are deposited. $SiO_2$ and CaO are produced as amorphous materials.

The mixed oxide 24 needs only to contain crystalline particulate materials of at least one of the corundum phase, the spinel phase, and the garnet phase.

By depositing crystalline particulate materials in the mixed oxide 24, it is possible to improve resistance to plasma.

Also, in a case where it is unnecessary to consider resistance to plasma, the whole of the mixed oxide 24 may be composed of amorphous materials.

Also, the spherical oxide ceramic particles 22 of the porous body 20 are composed of the corundum phase ($Al_2O_3$).

The upper surface of the ceramic substrate 10 and the upper surfaces of the porous bodies 20 form a flat surface. Also, similarly, the lower surface of the ceramic substrate 10 and the lower surfaces of the porous bodies 20 form a flat surface.

In a case of using the sintered body 1 as a chuck unit of an electrostatic chuck, since the upper surface is a flat surface, it is possible to suck a wafer with high reliability.

Figure 3:
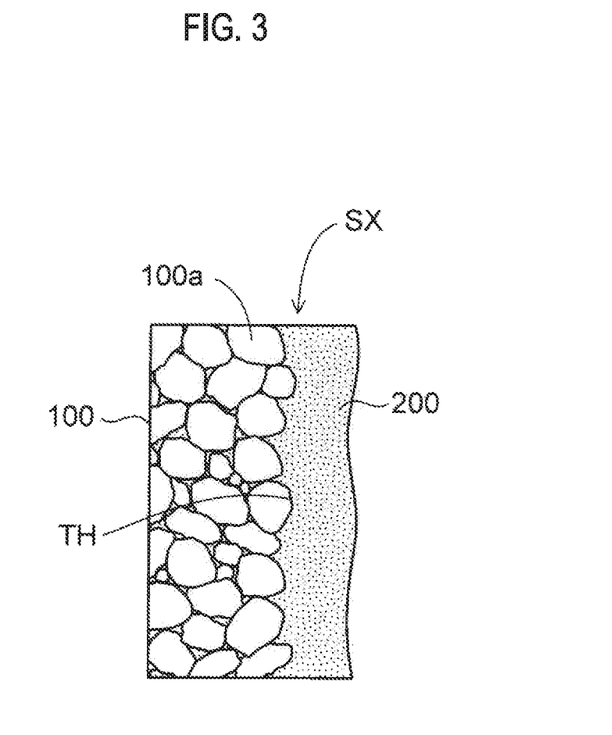
FIG. 3 is a cross-sectional view illustrating the aspect of the inner wall of a through-hole of a ceramic substrate of a comparative example.

FIG. 3 shows the aspect of the inner wall of a through-hole TH of a ceramic substrate 100 of a comparative example. In the comparative example of FIG. 3, as described with respect to the preliminary technologies, a sintered body is made by filling through-holes of an unsintered ceramic composition body with paste for porous bodies which is a precursor of the porous bodies, and sintering the ceramic composition body and the paste at the same time. In this way, the ceramic substrate 100, and porous bodies 200 disposed in the through-holes are obtained.

In this case, as shown in FIG. 3, the spherical surfaces of oxide particles 100a are exposed from the inner wall of the through-hole TH of the ceramic substrate 100. The reason is that the through-hole TH is not formed by processing the ceramic substrate 100 after sintering, and are formed in the unsintered ceramic composition body, and thus the particle shapes of the oxide particles 100a are maintained even after sintering.

Therefore, in the comparative example of FIG. 3, if the oxide particles 100a have micrometer-level sizes, the inner wall of the through-hole TH of the ceramic substrate 100 has a surface SX with micro irregularities composed of connected spherical surfaces. Therefore, when the through-hole of the unsintered ceramic composition body is filled with the paste for the porous body, it is difficult to fill the through-hole, and the through-hole is likely to be unevenly filled.

In the present embodiment, as shown in FIG. 2B described above, the side surfaces of the plurality of oxide particles 10a exposed from the inner wall of the through-hole TH of the ceramic substrate 10 form flat surfaces. Therefore, it is possible to evenly fill the through-hole with the paste for the porous body.

Also, in the porous body 20 of the present embodiment, the outer surfaces of the spherical oxide ceramic particles 22 having relatively low roughness are exposed from the inner walls of the pores. Further, the porous body 20 is formed by binding the spherical oxide ceramic particles 22 with the mixed oxide 24 such that desired porosity is obtained. Therefore, it is possible to improve the accuracy of the sizes of the pores P.

Therefore, when a gas flows in the gas conduit parts, it is possible to reduce the friction resistance of the conduits, and reduce pressure loss.

Also, as will be described below, the porous bodies 20 are obtained by sintering the ceramic substrate 10, and filling the through-holes TH with the paste, and sintering the paste. The porous bodies 20 are made in a state where it has rarely contracted during sintering.

Therefore, it is possible to reduce the size of the through-holes TH of the ceramic substrate 10, and it is possible to improve the accuracy of the shape, size, and positions of the gas conduit parts G composed of the porous body 20.

Now methods of manufacturing the above-described sintered body 1 of FIGS. 2A and 2B having the porous bodies 20 will be described.

(Manufacturing Method of First Example)

In a manufacturing method of a first example, as shown in FIG. 4A, first, an aluminum oxide substrate 11 having a thickness of about 5 mm and the purity of 94% is prepared.

The aluminum oxide substrate 11 is a sintered body which can be obtained by sintering a ceramic composition body at a temperature of about 1500° C. The aluminum oxide substrate 11 is sintered such that the relative density becomes 90% or more. The aluminum oxide substrate 11 is an example of the ceramic substrate 10 of FIG. 2B described above.

Subsequently, as shown in FIG. 4B, through-holes TH are formed by boring through the aluminum oxide substrate 11 in the thickness direction with a drill.

As a result, as described above with reference to FIG. 2B, the side surfaces of aluminum oxide particles (not shown in the drawings) constituting the aluminum oxide substrate 11, that is, the cutting surfaces of the particles form flat surfaces, and the inner walls of the through-holes TH have flat surfaces S. The aluminum oxide particles are examples of the oxide particles 10a of FIG. 2B described above.

The diameters of the through-holes TH are, for example, 1 mm to 3 mm. The plurality of through-holes TH in the aluminum oxide substrate 11 may have the same diameter, or may have different diameters.

Instead of the drill, a laser may be used to form the through-holes TH in the aluminum oxide substrate 11. Even in this case, similarly, the inner walls of the through-holes TH have flat surfaces.

Subsequently, as shown in FIG. 4C, the aluminum oxide substrate 11 is mounted on a stage 5 with a release sheet (not shown in the drawings) interposed therebetween. Also, paste 20a is prepared as a precursor for the porous bodies 20 described above with reference to FIG. 2B.

The paste 20a contains 83.3% by weight of spherical oxide ceramic particles having a diameter of 10 μm. The other components of the paste 20a are composed of oxides containing five components of silicon (Si), magnesium (Mg), calcium (Ca), aluminum (Al), and yttrium (Y), an organic binder, and a solvent.

As the organic binder, polyvinyl butyral can be used. As the solvent, alcohol can be used.

The spherical aluminum oxide particles are examples of the spherical oxide ceramic particles 22 of FIG. 2B described above.

Also, the oxides containing five components of silicon, magnesium, calcium, aluminum, and yttrium are examples of the materials of the mixed oxide 24 of FIG. 2B described above.

Subsequently, the paste 20a is swept in the transverse direction by a squeegee 6, whereby the through-holes TH of the aluminum oxide substrate 11 are filled with the paste 20a.

In this way, the plurality of through-holes TH of the aluminum oxide substrate 11 is filled with the paste 20a as shown in FIG. 5A.

Since the aluminum oxide substrate 11 has been already sintered, in the subsequent sintering process, the substrate is not deformed by contraction or the like. Therefore, it is possible to prevent change of the size and positions of the through-holes TH. Also, even in a case where the through-holes TH of the aluminum oxide substrate 11 have small diameters of 3 mm or less, it is possible to easily fill the through-holes TH with the paste 20a.

Subsequently, as shown in FIG. 5B, the paste 20a is sintered at a temperature of about 1400° C. lower than the sintering temperature of the aluminum oxide substrate 11 by about 100° C., whereby the porous bodies 20 are made in the through-holes TH of the aluminum oxide substrate 11.

At this time, as described above, the aluminum oxide substrate 11 and the mixed oxide of the paste 20a have the same composition ratio of silicon, magnesium, calcium, and yttrium.

Therefore, during the sintering, mass transfer does not occur between the aluminum oxide substrate 11 and the paste 20a. Therefore, it is possible to secure flatness of the interfaces of the porous bodies 20 and the inner walls of the through-holes TH of the aluminum oxide substrate 11.

Also, at this time, the porous bodies 20 are made so as to protrude upward from the upper ends of the through-holes TH of the aluminum oxide substrate 11.

For this reason, surface grinding is performed on the upper surfaces of the aluminum oxide substrate 11 and the porous bodies 20, whereby the upper surface of the aluminum oxide substrate 11 and the upper surfaces of the porous bodies 20 are flattened so as to form a flat surface, as shown in FIG. 5C.

Also, if necessary, surface grinding is performed even on the lower surfaces of the aluminum oxide substrate 11 and the porous bodies 20, such that the lower surfaces become flat.

In this way, the porous bodies 20 are disposed in the through-holes TH of the aluminum oxide substrate 11, whereby the gas conduit parts G are obtained.

As shown in FIG. 2B described above, the porous body 20 is formed of the spherical oxide ceramic particles 22 and the mixed oxide 24 for binding the particles, and the mixed oxide 24 adheres to the inner wall of the through-hole TH of the aluminum oxide substrate 11.

In this way, the sintered body 1 having the gas conduit parts G composed of the porous bodies 20 is manufactured.

As described above, in the first example, the spherical aluminum oxide particles are used as the spherical oxide ceramic particles 22 of FIG. 2B described above. Also, the oxides of five components of silicon, magnesium, calcium, aluminum, and yttrium are used as the mixed oxide 24 of FIG. 2B.

When the porous bodies 20 were actually made by e manufacturing method of the first example, the porosity was 31%.

(Manufacturing Method of Second Example)

In a manufacturing method of a second example, as described in the first example with reference to FIGS. 4A and 4B, first, through-holes TH are formed in an aluminum oxide substrate 11.

Paste 20a which is used in the second example contains 87.0% by weight of spherical aluminum oxide particles having a diameter of 100 μm. The other components of the paste 20a are composed of oxides containing four components of silicon, magnesium, calcium, and yttrium, an organic binder, and a solvent.

Subsequently, as described in the first example with reference to FIGS. 4C to 5B, the through-holes TH of the aluminum oxide substrate 11 are filled with the paste 20a, and sintering is performed, whereby porous bodies 20 are formed. Subsequently, as described in the first example with reference to FIG. 5C, the upper surface of the aluminum oxide substrate 11 and the upper surfaces of the porous bodies 20 are flattened so as to form a flat surface by surface grinding.

In this way, the porous bodies 20 are disposed in the through-holes TH of the aluminum oxide substrate 11, whereby the gas conduit parts G are obtained.

In the second example, the spherical aluminum oxide particles are used as the spherical oxide ceramic particles 22 of FIG. 2B described above. Also, the oxides of four components of silicon, magnesium, calcium, and yttrium are used as the mixed oxide 24 of FIG. 2B.

When the porous bodies 20 were actually made by the manufacturing method of the second example, the porosity was 38%.

(Manufacturing Method of Third Example)

In a manufacturing method of a third example, as described in the first example with reference to FIGS. 4A and 4B, first, through-holes TH are formed in an aluminum oxide substrate 11.

Paste 20a which is used in the second example contains 95.2% by weight of spherical aluminum oxide particles having a diameter of 100 μm. The other components of the paste 20a are composed of oxides containing four components of silicon, magnesium, calcium, and yttrium, an organic binder, and a solvent.

Subsequently, as described in the first example with reference to FIGS. 4C to 5B, the through-holes TH of the aluminum oxide substrate 11 are filled with the paste 20a, and sintering is performed, whereby porous bodies 20 are formed. Subsequently, as described in the first example with reference to FIG. 5C, the upper surface of the aluminum oxide substrate 11 and the upper surfaces of the porous bodies 20 are flattened so as to form a flat surface by surface grinding.

In this way, the porous bodies 20 are disposed in the through-holes TH of the aluminum oxide substrate 11, whereby the gas conduit parts G are obtained.

In the third example, the spherical aluminum oxide particles are used as the spherical oxide ceramic particles 22 of FIG. 2B described above. Also, the oxides of four components of silicon, magnesium, calcium, and yttrium are used as the mixed oxide 24 of FIG. 2B.

When the porous bodies 20 were actually made by the manufacturing method of the third example, the porosity was 40%.

(Manufacturing Method of Fourth Example)

In a manufacturing method of a fourth example, as described in the first example with reference to FIGS. 4A and 4B, through-holes TH are formed in an aluminum oxide substrate 11.

Paste 20a which is used in the fourth example contains 94.1% by weight of spherical aluminum oxide particles having a diameter of 100 μm. The other components of the paste 20a are composed of oxides containing five components of silicon, magnesium, calcium, aluminum, and yttrium, an organic binder, and a solvent.

Subsequently, as described in the first example with reference to FIGS. 4C to 5B, the through-holes TH of the aluminum oxide substrate 11 are filled with the paste 20a, and sintering is performed, whereby porous bodies 20 are formed. Subsequently, as described in the first example with reference to FIG. 5C, the upper surface of the aluminum oxide substrate 11 and the upper surfaces of the porous bodies 20 are flattened so as to form a flat surface by surface grinding.

In this way, the porous bodies 20 are disposed in the through-holes TH of the aluminum oxide substrate 11, whereby the gas conduit parts G are obtained.

In the fourth example, the spherical aluminum oxide particles are used as the spherical oxide ceramic particles 22 of FIG. 2B described above. Also, the oxides of five components of silicon, magnesium, calcium, aluminum, and yttrium are used as the mixed oxide 24 of FIG. 2B.

When the porous bodies 20 were actually made by the manufacturing method of the fourth example, the porosity was 37%.

As described above, the porous bodies 20 of the sintered body 1 of the present embodiment are obtained by forming the through-holes TH in the sintered ceramic substrate 10, and filling the through-holes TH with the paste 20a, and performing sintering.

Therefore, unlike the case of making porous bodies 20 by sintering an unsintered ceramic substrate 10 and paste for the porous bodies at the same time, the cutting surfaces of the oxide particles 10a form the flat surfaces S of the inner walls of the through-holes TH of the ceramic substrate 10.

Also, unlike the method of disposing separately sintered porous bodies in through-holes TH of a ceramic substrate 10, it is unnecessary to provide an adhesive medium such as an epoxy resin between the through-holes TH of the ceramic substrate 10 and the porous bodies 20.

Therefore, in a case of using the sintered body 1 in an electrostatic chuck, since there is no adhesive medium likely to deteriorate due to plasma, it is possible to improve the reliability of the electrostatic chuck.

Further, formation of the pores P of the porous bodies 20 is actually defined by the state of the through-holes filled with the spherical oxide ceramic particles 22, and the distribution of the mixed oxide 24 binding those particles.

Therefore, by controlling the weight ratio and the like of spherical oxide ceramic particles 22 in the paste 20a, it is possible to make porous bodies 20 unlikely to contract during sintering.

As exemplified in the manufacturing methods of the first to fourth examples described above, the weight ratio of spherical aluminum oxide particles (spherical oxide ceramic particles 22 of FIG. 2B) in the paste 20a is set to 80% or more by weight. As a result, the porous bodies 20 unlikely to contract during sintering are obtained.

Therefore, it is possible to adhere the porous bodies 20 to the entire inner walls of the through-holes TH of the ceramic substrate 10 with high reliability, without gaps and separation. Also, it is possible to improve the accuracy of the shape, size, and positions of the gas conduit parts G composed of the porous body 20. Further, it becomes possible to design the porosity of porous bodies 20, and thus it is possible to obtain gas conduit parts G having desired porosity.

Also, even in a case where the through-holes TH of the ceramic substrate 10 have small diameters of 3 mm or less, it is possible to form the gas conduit parts G composed of the porous bodies 20 in the through-holes TH with high reliability by a method of filling the through-holes with the paste 20a.

Next, the porosity of the porous body, and the helium gas pressure drop and the helium gas flow rate of the gas conduit part with respect to the diameter of the spherical oxide ceramic particles will be described.

Figure 7:
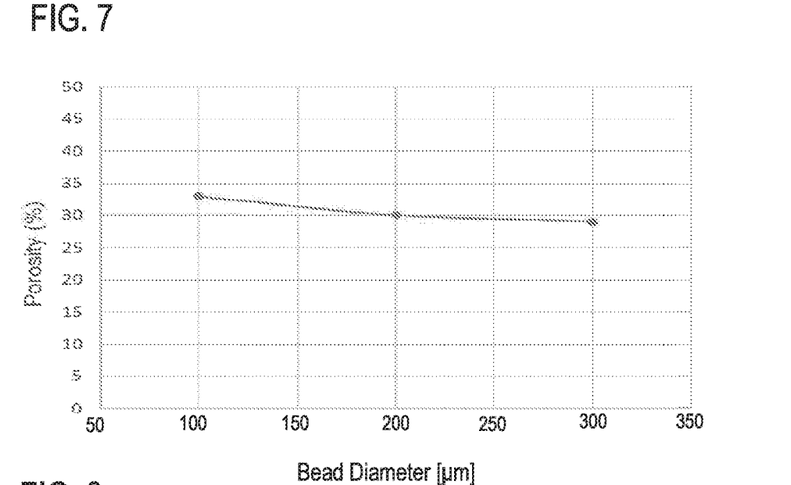
FIG. 7 is a graph showing the relationship of the porosity and the diameter of the spherical oxide ceramic particles.
Figure 8:
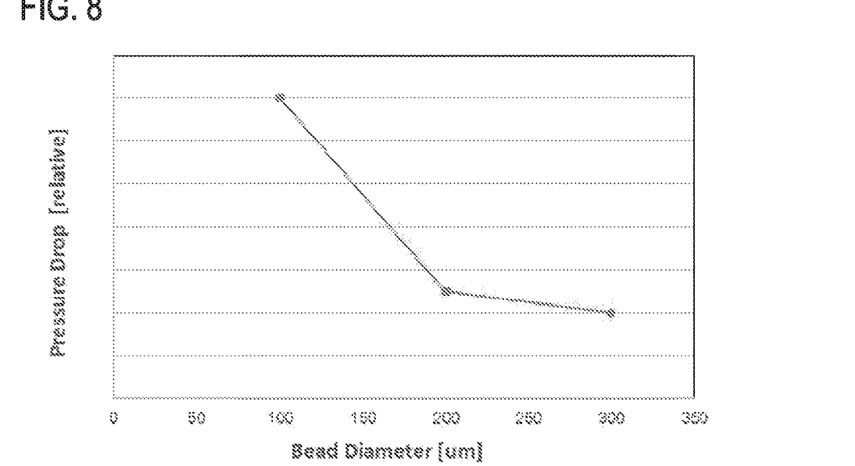
FIG. 8 is a graph showing the relationship of the helium gas pressure drop and the diameter of the spherical oxide ceramic particles.
Figure 9:
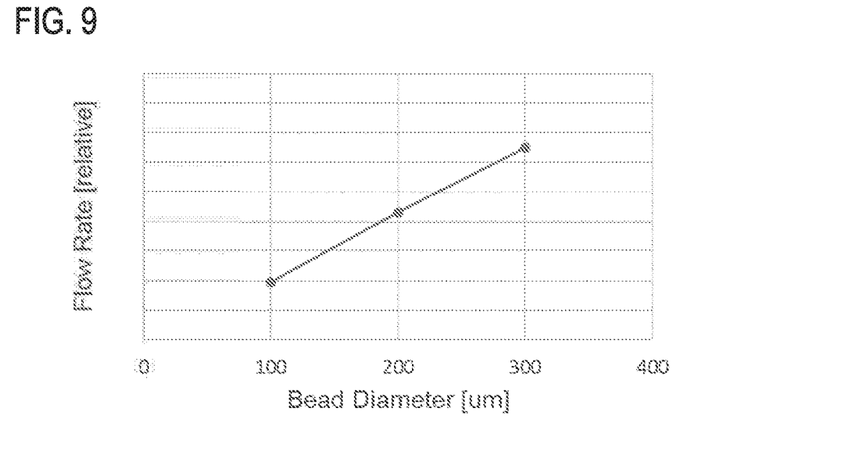
FIG. 9 is a graph showing the relationship of the helium gas flow rate and the diameter of the spherical oxide ceramic particles.

Three gas conduit parts were obtained by using pastes containing 94% by weight of spherical aluminum oxide particles having diameters of 100 μm, 200 μm, 300 μm, respectively, based on the manufacturing method of the above examples, and their porosity of their porous bodies, the helium gas pressure drop and the helium gas flow rate of the gas conduit parts were measured. The respective results are shown in FIGS. 7-9. Since the helium gas pressure drop and the helium gas flow rate are varied by parameters such as the helium supply pressure, and the through hole diameter and the length of the gas conduit part, FIGS. 8-9 show their relative values in a case where these parameters are set to be same.

As shown in FIG. 7, the change of the porosity of the porous body due to the variation of the particle diameter was small. In the helium gas pressure drop of the gas conduit part, as shown in FIG. 8, the value of the pressure drop was decreased as the particle diameter was increased. In the helium gas flow rate of the gas conduit part, as shown in FIG. 9, the value of the flow rate was increased as the particle diameter was increased. From these results, it was confirmed that the gas flow rate can be effectively changed by changing the particle diameter of the spherical oxides even in the same composition or the same conduction.

Now, an electrostatic chuck using the sintered body 1 of FIGS. 2A and 2B described above will be described. As shown in FIG. 6, in an electrostatic chuck 2 of the embodiment, the sintered body 1 having the structure as shown in FIGS. 2A and 2B described above is disposed on a base plate 40 formed of aluminum and the like.

As described above, the sintered body 1 has the ceramic substrate 10, and the porous bodies 20 disposed in the through-holes formed through the ceramic substrate in thickness direction.

As shown in FIG. 6, in a case of using the sintered body 1 of the embodiment as a chuck unit of the electrostatic chuck 2, inside the ceramic substrate 10, electrostatic electrodes 30 and wiring terminals 32 connected to the electrostatic electrodes are disposed. The wiring terminals 32 extend from the lower surfaces of the electrostatic electrodes 30 to the lower surface of the ceramic substrate 10.

The ceramic substrate 10 having the electrostatic electrodes 30 and the wiring terminals 32 disposed therein is obtained by providing a material to be the electrostatic electrodes 30 and the wiring terminals 32 in a green sheet for forming the ceramic substrate 10 and sintering that laminate. As the material of the electrostatic electrodes 30 and the wiring terminals 32, tungsten paste and the like can be used.

The base plate 40 has gas supply holes 42 formed through the plate so as to be connected to the porous body 20 formed in the ceramic substrate 10. Also, the base plate 40 has relay wiring lines 44 connected to the wiring terminals 32 exposed from the lower surface of the ceramic substrate 10.

The base plate 40 and the ceramic substrate 10 of the sintered body 1 are adhered by a silicone adhesive or the like.

Further, on the ceramic substrate 10 of the electrostatic chuck 2, a wafer 50 is mounted as an object to be sucked. Subsequently, a predetermined voltage is applied to the electrostatic electrodes 30 from an external power source through the relay wiring lines 44 of the base plate 40 and the wiring terminals 32 of the ceramic substrate 10.

Then, the wafer 50 is electrostatically sucked onto the electrostatic chuck 2 by a force generated between the water 50 and the ceramic substrate 10.

Thereafter, a heat-transfer gas is supplied from the gas supply holes 42 of the base plate 40 into the gas conduit parts G composed of the porous bodies 20 formed in the ceramic substrate 10. As the heat-transfer gas, an inert gas such as helium (He) can be used.

Also, temperature adjustment means such as a cooling jacket and a heater are provided so as to be in contact with the rear surface of the electrostatic chuck 2, and the temperature of the wafer 50 is adjusted to a desired temperature through the electrostatic chuck 2 by the temperature adjustment means.

At this time, by supplying the heat-transfer gas between the electrostatic chuck 2 and the wafer 50, it is possible to efficiently cool the wafer 50 by the electrostatic chuck 2, or efficiently transfer the heat of the heated electrostatic chuck 2 to the wafer 50.

In the electrostatic chuck 2 of the present embodiment, the gas conduit parts G are composed of the porous bodies. Therefore, it is possible to prevent electric discharge at the gas conduit parts G when the electrostatic chuck is used in plasma equipment, and it is possible to improve the reliability of the electrostatic chuck.

Also, as described above, the inner walls of the through-holes TH of the ceramic substrate 10 have the flat surfaces S, and the porous bodies 20 which are disposed in the through-holes TH of the ceramic substrate 10 are formed of the spherical oxide ceramic particles 22 and the mixed oxide 24 for binding those particles.

Therefore, when the heat-transfer gas flows in the gas conduit parts G, it is possible to reduce the friction resistance of the conduits, and reduce pressure loss.

Therefore, even in the case where the gas conduit parts G are composed of the porous bodies 20, it is possible to sufficiently supply the heat-transfer gas between the electrostatic chuck 2 and the wafer 50, and thus it is possible to perform adjustment on the temperature of the wafer 50 with high reliability.

Also, between the inner walls of the through-holes TH of the ceramic substrate 10 and the porous bodies 20, there is no adhesive medium likely to deteriorate due to plasma. Therefore, it is possible to increase the life of the electrostatic chuck when the electrostatic chuck is applied to plasma equipment, and it is possible to improve the reliability of processes of various equipments.

The electrostatic chuck 2 of the present embodiment can be suitably used in various equipments such as dry etching equipment, CVD equipment, and PVD equipment for various processes such as processes on semiconductor wafers and processes of manufacturing element substrates for liquid crystal displays.

Also, the sintered body 1 of the present embodiment can be applied not only to electrostatic chucks but also various other apparatuses such as filters.

This disclosure further encompasses various exemplary embodiments, for example, described below.

1. A method of manufacturing a sintered body, comprising:
   preparing a sintered ceramic substrate;
   forming a through-hole in the ceramic substrate;
   filling the through-hole with paste including spherical oxide ceramic particles and a mixed oxide; and sintering the paste, thereby forming a porous body including the spherical oxide ceramic particles bound by the mixed oxide, in the through-hole.

What is claimed is:

1. A sintered body comprising: a ceramic substrate including sintered oxide particles; a through-hole formed in the ceramic substrate such that side surfaces of the sintered oxide particles exposed from an inner wall of the through-hole form a flat surface; and a porous body disposed in the through-hole, the porous body including spherical oxide ceramic particles and a mixed oxide configured to bind the spherical oxide ceramic particles; wherein a diameter of the spherical oxide ceramic particles is in a range between 100 µm and 300 µm.

2. The sintered body according to claim 1, wherein:
a weight ratio of the spherical oxide ceramic particles in the porous bodies is 80% or more by weight.

3. The sintered body according to claim 1, wherein:
the mixed oxide of the porous body is formed of crystalline particulate materials and amorphous materials.

4. The sintered body according to claim 3, wherein:
the crystalline particulate materials include at least one of a corundum phase, a spinel phase, and a garnet phase.

5. The sintered body according to claim 1, wherein:
the mixed oxide of the porous body is formed of oxides of two or more selected from silicon, magnesium, calcium, aluminum, and yttrium.

6. The sintered body according to claim 5, wherein:
the ceramic substrate is an aluminum oxide substrate including silicon, magnesium, calcium, and yttrium, and
the composition ratio of silicon, magnesium, calcium, and yttrium in the mixed oxide of the porous body is the same as the composition ratio of silicon, magnesium, calcium, and yttrium in the ceramic substrate.

7. The sintered body according to claim 1, wherein:
the spherical oxide ceramic particles of the porous body include a corundum phase.

8. The sintered body according to claim 1, wherein:
a porosity of the porous body is between 20% and 50%.

9. An electrostatic chuck comprising: a ceramic substrate including sintered oxide particles; a through-hole formed in the ceramic substrate such that side surfaces of the sintered oxide particles exposed from an inner wall of the through-hole form a flat surface; a gas conduit part including a porous body disposed in the through-hole, the porous body including spherical oxide ceramic particles and a mixed oxide configured to bind the spherical oxide ceramic particles; and an electrostatic electrode disposed in the ceramic substrate; wherein a diameter of the spherical oxide ceramic particles is in a range between 100 µm and 300 µm.

10. A sintered body comprising: a ceramic substrate including sintered oxide particles, the ceramic substrate being formed by sintering a ceramic composition body; a through-hole formed in the ceramic substrate by boring the ceramic substrate after sintering of the ceramic composition body, the through-hole being formed such that side surfaces of the sintered oxide particles exposed from an inner wall of the through-hole form a flat surface; and a porous body disposed in the through-hole, the porous body including spherical oxide ceramic particles and a mixed oxide configured to bind the spherical oxide ceramic particles; wherein a diameter of the spherical oxide ceramic particles is in a range between 100 µm and 300 µm.

11. The sintered body according to claim 1, wherein:
the side surfaces of the sintered oxide particles exposed from the inner wall of the through-hole form the flat surface without micro irregularities caused by spherical surfaces of the sintered oxide particles being exposed from the inner wall of the through-hole.

12. The electrostatic chuck according to claim 9, wherein:
the side surfaces of the sintered oxide particles exposed from the inner wall of the through-hole form the flat surface without micro irregularities caused by spherical surfaces of the sintered oxide particles being exposed from the inner wall of the through-hole.

13. The sintered body according to claim 10, wherein:
the side surfaces of the sintered oxide particles exposed from the inner wall of the through-hole form the flat surface without micro irregularities caused by spherical surfaces of the sintered oxide particles being exposed from the inner wall of the through-hole.

14. The electrostatic chuck according to claim 9, wherein:
the mixed oxide of the porous body is formed of crystalline particulate materials and amorphous materials.

* * * * *